(12) United States Patent
Roehr et al.

(10) Patent No.: US 6,885,597 B2
(45) Date of Patent: Apr. 26, 2005

(54) SENSING TEST CIRCUIT

(75) Inventors: Thomas Roehr, Kanagawa (JP);
Hans-Oliver Joachim, Kanagawa (JP);
Michael Jacob, Kanagawa (JP); Joerg Wohlfahrt, Kanagawa (JP); Takashima Daisaburo, Tokyo (JP)

(73) Assignees: Infineon Technologies Aktiengesellschaft, Munich (DE);
Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 10/065,011

(22) Filed: Sep. 10, 2002

(65) Prior Publication Data

US 2004/0047171 A1 Mar. 11, 2004

(51) Int. Cl.[7] ............................................. G11C 29/00
(52) U.S. Cl. ................... 365/201; 365/149; 365/189.07
(58) Field of Search ................................. 365/201, 149, 365/189.07, 206, 207, 145

(56) References Cited

U.S. PATENT DOCUMENTS

| | | | | |
|---|---|---|---|---|
| 5,297,087 A | * | 3/1994 | Porter | 365/201 |
| 5,491,435 A | | 2/1996 | Mun et al. | 327/55 |
| 5,926,428 A | | 7/1999 | Rao | 365/207 |
| 5,982,682 A | * | 11/1999 | Nevill et al. | 365/201 |
| 6,038,180 A | | 3/2000 | Hoshi | 365/201 |
| 6,055,200 A | | 4/2000 | Choi et al. | 365/201 |
| 6,141,270 A | * | 10/2000 | Casper | 365/201 |
| 6,288,950 B1 | | 9/2001 | Koike | 365/189.09 |
| 6,658,608 B1 | | 12/2003 | Kamp et al. | 714/718 |
| 2001/0033514 A1 | | 10/2001 | Takata et al. | 365/189.07 |
| 2001/0055229 A1 | | 12/2001 | Koike | 365/200 |
| 2002/0031003 A1 | | 3/2002 | Hoya et al. | 365/143 |
| 2002/0079743 A1 | | 6/2002 | Ma et al. | 307/109 |
| 2002/0093847 A1 | | 7/2002 | Tada | 365/145 |

FOREIGN PATENT DOCUMENTS

| | | |
|---|---|---|
| JP | 03209688 | 9/1991 |
| JP | 11353898 | 12/1999 |

* cited by examiner

*Primary Examiner*—Richard Elms
*Assistant Examiner*—Nam Nguyen
(74) *Attorney, Agent, or Firm*—Horizon IP Pre Ltd

(57) ABSTRACT

A test circuit for testing differential read signals during a memory access is disclosed. The test circuit is coupled to a pair of bit lines. During a read access, a selected memory cell produces a differential read signal on the bit lines. When the test circuit is activated, the magnitude of the differential read signal is varied. This enables easy testing of read signal margins in, for example, memory ICs.

39 Claims, 5 Drawing Sheets

SENSING TEST CIRCUIT

BACKGROUND OF INVENTION

FIG. 1 shows a conventional 2T2C ferroelectric random access memory cell 105. The memory cell comprises first and second ferroelectric capacitors 140a and 140b, each having a ferroelectric material, such as lead zirconate titanate (PZT), located between first and second plates. First plates of the capacitors are commonly coupled to a plateline 170 while second plates or the capacitors are coupled to respective bitlines 150a and 150b of a bitline pair via cell transistors 130a and 130b. The gates of the transistors of a memory cell are commonly coupled to a wordline 160. The bitline pair includes additional memory cells, forming a column of memory cells.

A sense amplifier having inverting and non-inverting terminals is coupled to one end of the bitline pair. One bitline (BL) is coupled to the non-inverting terminal of the sense amplifier while the other bitline (/BL) is coupled to the inverting terminal. The other end of the bitlines of the bitline pair is coupled to ground. Each bitline has a biltine capacitance. The bitline capacitance usually originates from parasitic capacitances caused by, for example, wire to wire coupling or junction capacitance. In some applications, a capacitor may be coupled to the bitline to provide the bitline with the desired bitline capacitance value. The capacitor, for example, can be formed by a gate oxide capacitance. The bitline capacitance is needed for the cell capacitor to produce a read signal on the bitline. For a ferroelectric capacitor, the magnitude of the read signal depends on the polarization direction of the ferroelectric material. For example, a first polarization direction produces a read signal equal to a first voltage level (e.g., $V_{LO}$) while the other direction produces a read signal equal to a second voltage level (e.g., $V_{HI}$)

The two capacitors of a 2T2C memory cell are always in the opposite state. One bitline will have a read signal equal to $V_{LO}$ and the other $V_{HI}$ when a memory cell is read. The two signals produce a differential read signal (e.g., difference between $V_{LO}$ and $V_{HI}$). Depending on whether the differential signal is positive or negative, a logic 1 or logic 0 is stored in the cell. By storing the bit of information in opposite states in two capacitors, the two read signals from a cell are compared with each other. This eliminates the need of a reference voltage to perform a read. The absence of a reference voltage, however, makes it difficult to vary the sensing window (e.g., difference between $V_{LO}$ and $V_{HI}$) for performing signal margin tests during reliability testing of the IC. From the foregoing discussion, it is desirable to provide signal margin test circuit for 2T2C memory ICs.

SUMMARY OF INVENTION

The invention relates generally to ICs and more particularly, to a test circuit which varies the read signals on bitlines in ICs with memory cells to perform read signal margin test. In one embodiment, the IC comprises first and second bitlines coupled to a sense amplifier. A plurality of memory cells are coupled to bitlines. During a read access, a selected memory cell produces a differential read signal on the bitlines for sensing by the sense amplifier. In accordance with the invention, a test circuit is coupled to the bitlines. The test circuit, when activated during test mode, varies the magnitude of the differential read signal.

DETAILED DESCRIPTION

Figure 2:
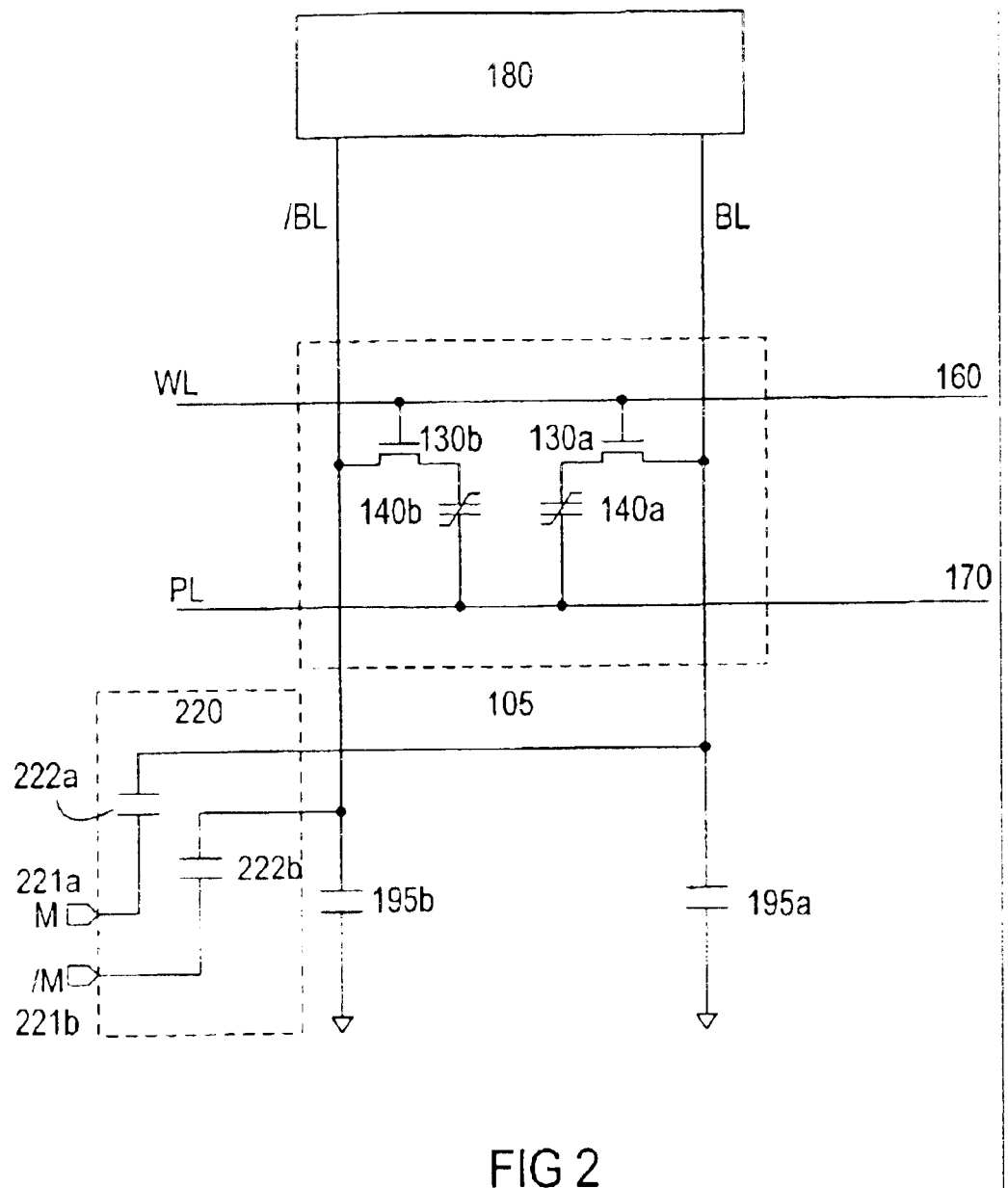
FIG. 2 shows an embodiment of the invention.

FIG. 2 shows a column of 2T2C memory cells in accordance with one embodiment of the invention. As shown, the column includes a pair of complementary bitlines having first and second bitlines 150a and 150b. A sense amplifier 180 is coupled to first ends of the bitlines. In one embodiment, the bitline coupled to the non-inverting terminal of the sense amplifier is referred to as the bitline true (BL). The other bitline, which is coupled to the inverting terminal of the sense amplifier, is referred to as bitline complement (/BL).

Figure 1:
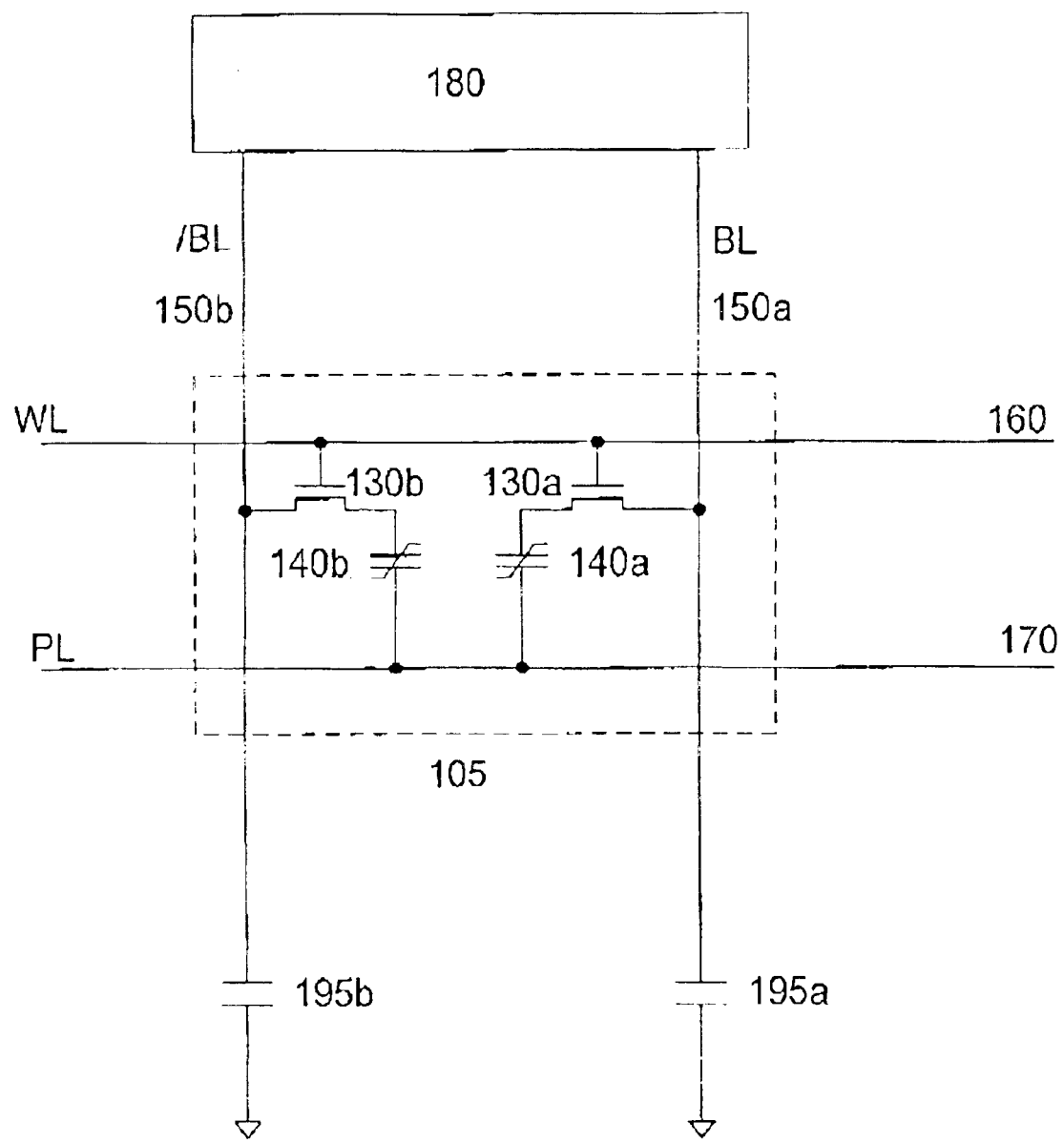
FIG. 1 shows a conventional 2T2C ferroelectric memory cell.

The bitline pair includes a plurality of 2T2C memory cells 105, such as those described in FIG. 1. The 2T2C memory cells, in one embodiment, are ferroelectric memory cells. Other types of 2T2C memory cells can also be used. A 2T2C ferroelectric cell includes first and second cell transistors 130a and 130b. In one embodiment, the first transistor is coupled to BL and a first ferroelectric capacitor 140a. The second transistor is coupled to /BL and a second ferroelectric capacitor 140b. A wordline 160 is coupled to the gates of the cell transistors and a plateline 170 is coupled to the capacitors.

Second ends of the bitlines are coupled to ground. As previously discussed, each bitline includes a bitline capacitance $C_{BL}$. The capacitance of each bitline should be closely matched with each other. Furthermore, depending on the application, this biltine capacitance can be augmented by bitline capacitors 195. As shown, the capacitors are located near the second ends of the bitlines. It is understood that the capacitors can be located anywhere along the bitlines. For purposes of discussion, $C_{BL}$ is the total capacitance on the bitline (e.g., parasitic bitline capacitance and capacitance from capacitor 195, if present). The value of the read signal on a bitline is equal to $C_{cap}/C_{BL}$, where $C_{cap}$ is equal to the effective capacitance of the capacitor and $C_{BL}$ is the bitline capacitance. For a ferroelectric capacitor, $C_{cap}$ depends on the polarization of the ferroelectric material of the capacitor.

In accordance with the invention, a reduced signal test (RST) circuit 220 is coupled to the bitline pair. The RST circuit facilitates signal margin testing of the IC by varying the sensing window. This is achieved by manipulating the differential read signal. In one embodiment, the differential read signal is manipulated by varying the total capacitance on the bitlines. Preferably, the differential read signal is manipulated by varying the total capacitance on one of the bitlines.

In one embodiment, the RST circuit comprises first and second test capacitors 222a–b coupled to respective first and second bitlines. A test capacitor is coupled in parallel to a bitline capacitor. First input terminal 221a is coupled to the first test capacitor and second input terminal 221b is coupled to the second test capacitor. The input terminals receive first and second test signals M and /M. In one embodiment, the test signals are complementary. That is, one is a logic 1 and the other is a logic 0.

During normal operation, both test signals are inactive (e.g., logic 0) to disable the RST circuit. When the RST circuit is disabled, the test capacitors only passively contribute to the bitline capacitance. As such, the test capacitors of the RST circuit do not interfere with the normal operations of the memory cells. In test mode, an active input test signal is provided (e.g., logic 1). In one embodiment, an active input test signal is provided at one of the inputs while the other input terminal receives an inactive input signal (e.g., inactive or logic 0). For example, an active signal can be provided on the input terminal M and the inactive signal on input terminal /M during test mode. Alternatively, an active signal can be provided on the input terminal /M and the inactive signal on input terminal M.

As the input signal transitions from a logic 0 to a logic 1 voltage level across the test capacitor, an additional amount of charge is added to the bitline, resulting in an increase in the read signal. The amount of electric charge depends on the magnitude of the active signal and capacitor. By providing an active test signal associated with the capacitor coupled to the bitline having a $V_{LO}$ read signal, $V_{LO}$ can be increased. Increasing $V_{LO}$ decreases the difference between $V_{LO}$ and $V_{HI}$, which in turn reduces the sensing window.

In one embodiment, the capacitance of the test capacitors is selected to increase the read signal by an amount less than the magnitude of the differential read signal (e.g., less than $V_{HI}V_{LO}$) for a given logic 1 signal. The capacitance is selected to reduce the sensing window by the desired amount to perform signal margin test. For example, the test capacitor reduces the sensing window by ½. Other values between $V_{HI}$ and $V_{LO}$ are also useful, e.g., ⅓. The amount of the increase of the read signal can be adjusted by either the size of the test capacitor or the magnitude of the voltage applied to the input terminal of the test capacitor.

Figure 3:
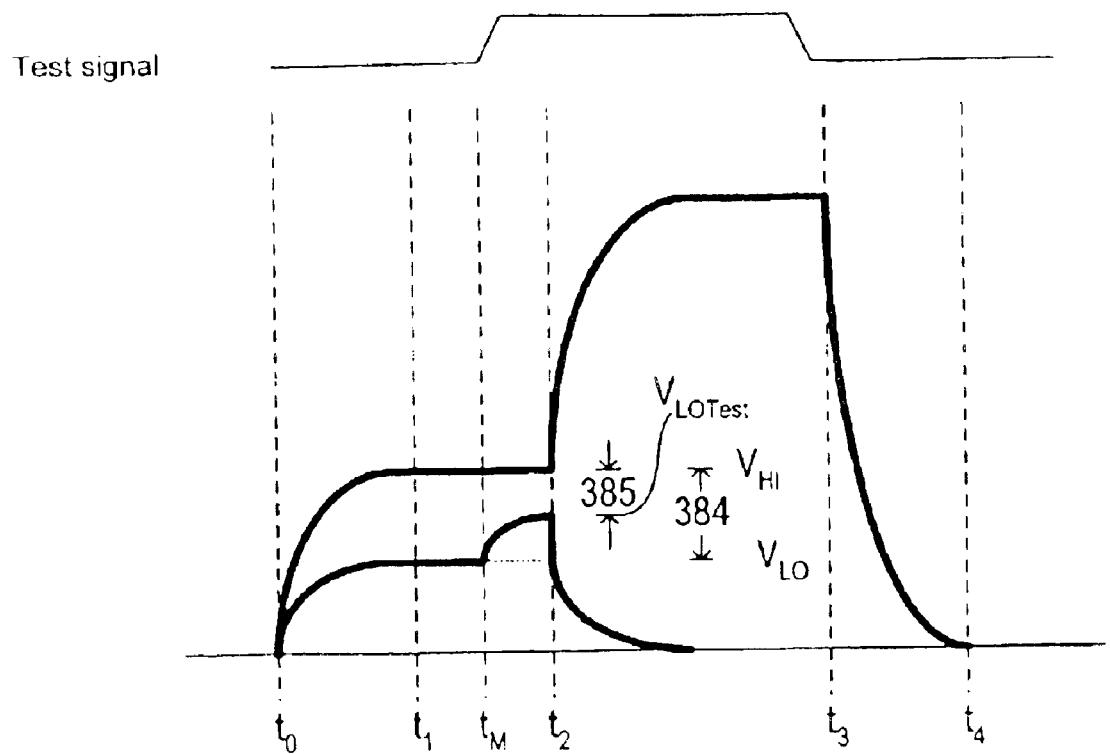
FIG. 3 shows a timing diagram of a test read access in test in accordance with one embodiment of the invention.

FIG. 3 shows the timing diagram of the read signals on the bitlines during test mode in accordance with one embodiment of the invention. To read from a memory cell, a pulse is provided on the plateline and a wordline is activated. The pulse causes an electric field across the capacitors, producing read signals on the bitlines at $t_0$. At $t_1$, the full read signals are developed on the bitlines. One capacitor produces a read signal equal to $V_{LO}$ and the other capacitor produces a read signal equal to $V_{HI}$. The two signals together form the differential read signal.

At $t_M$, an active test signal is provided at the input terminal associated with the capacitor coupled to the bitline having the $V_{LO}$ read signal. The active input test signal causes $V_{LO}$ to increase to $V_{LOTest}$. Without the active test signal, the read signal would have remained at $V_{LO}$ (indicated by the dotted line). The sense amplifier is activated at $t_2$, amplifying the signals to the full bitline voltage levels. After the signals have been amplified, the sense amplifier is switched off at $t_3$ and the read cycle terminates at $t_4$.

Through the use of the RST circuit in accordance with the invention, the normal sensing window 384 can be manipulated to form a smaller test sensing window 385. This facilitates performing signal margin tests on the IC. The signal margin can be selected to anticipate the expected aging of the memory cell, and thus reducing the read signal of the device over the whole lifetime. For example, if an IC fails the signal margin test (e.g., fails to amplify the read signal using the test sensing window,) it would be rejected.

Figure 4:
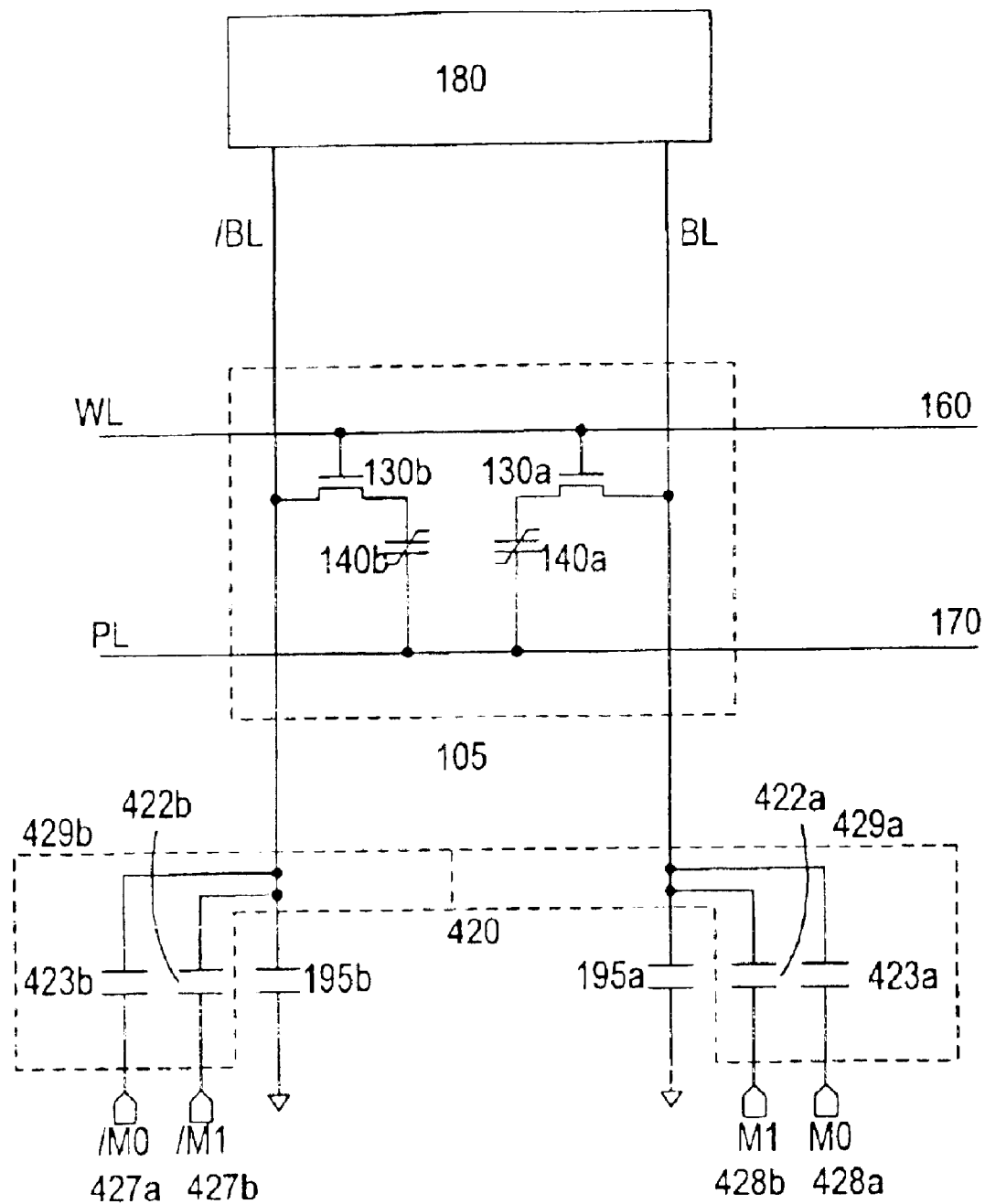
FIG. 4 shows an alternative embodiment of the invention.

In an alternative embodiment shown in FIG. 4, the test circuit 420 comprises first and second set of capacitors coupled to respective first and second bitlines. In one embodiment, an input terminal is associated with each capacitor for receiving a test control signal (e.g., input terminal 427 for first set of capacitors and input terminals 428 for the second set of capacitors). In one embodiment, a set of capacitors comprises n capacitors when n is a whole number$\geq 2$. The capacitors are coupled in parallel to the bitline. Preferably, the capacitors within a set have different capacitances. Having different capacitances allows the set of test capacitors to vary the read signal by $2^n-1$ times. This, in turn, can vary the sensing window by $2^n-1$ times. More preferably, the two sets of test capacitors each have the same number of capacitor with corresponding capacitance values.

In one embodiment, the capacitance of the test capacitors is selected to increase the read signal by an amount less than the magnitude of the differential read signal (e.g., less than $V_{HI}V_{LO}$). Preferably, the total capacitance of the capacitors increases the read signal by an amount less than the magnitude of the differential read signal. The capacitance of a capacitor within a set is selected to reduce the sensing window by the desired amount to perform signal margin test.

Illustratively, a set of capacitors comprises first and second test capacitors (422a and 423a or 422b and 423b). Preferably, the capacitors within a set have different capacitances. In one embodiment, the first capacitors of the sets have a first capacitance value and the second capacitors have a second capacitance value. The first capacitance value, for example, is less than the second capacitance value. For example, the first capacitors are ½ the size of the second capacitors. Other size ratios are also useful.

For a given magnitude of the active input signal, the first capacitance value increases the magnitude of the read signal by a first level and the second capacitance increases the read signal by a second level. In one embodiment, the second level is greater than the first level. The combination of the first and second capacitances increases the read signal by a third level. The first, second, and third levels are less than the magnitude of the differential read signal.

During test mode, one or more active test signals are provided to a set of capacitors of one of the bitlines. For example, one or more active test signals are provided to the test capacitors on BL (e.g., M0, M1, or both M0 and M1). The active test signal or signals increase the magnitude of the read signal accordingly.

Figure 5:
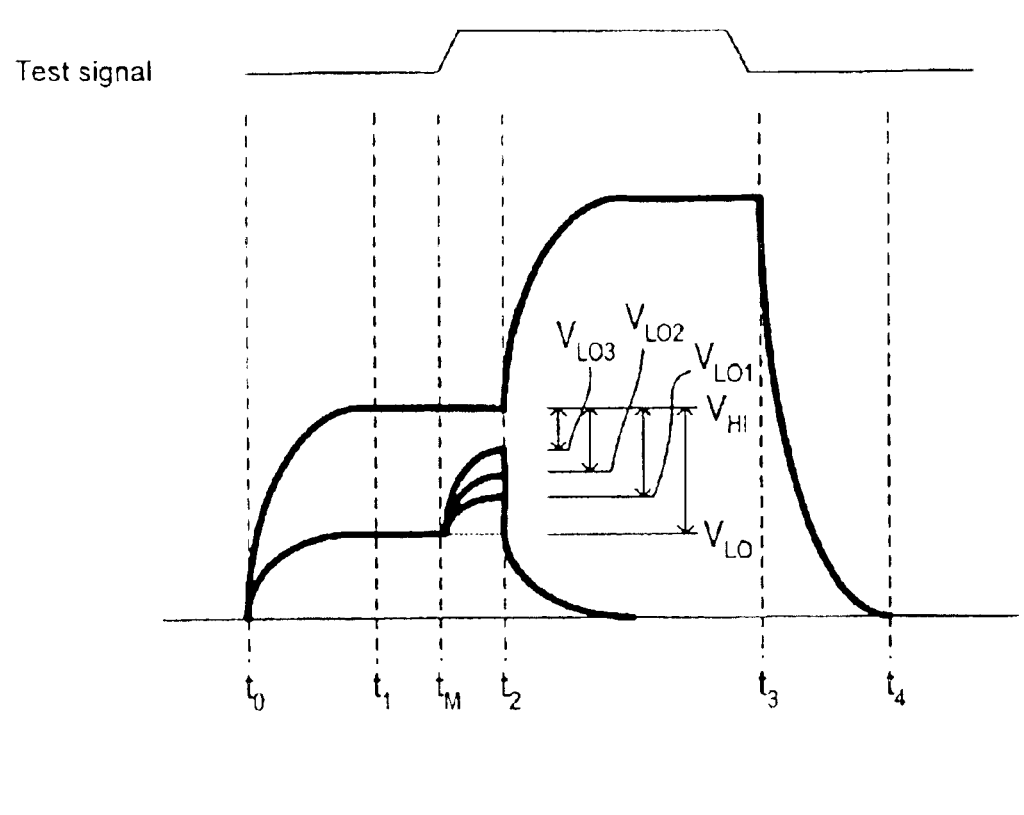
FIG. 5 shows a timing diagram of a test read access in test in accordance with another embodiment of the invention.

FIG. 5 shows a timing diagram of the read signals on the bitlines during test mode in accordance with another embodiment of the invention. Illustratively, the read signals are produced with an RST circuit having two sets of capacitors, each with first and second capacitors and corresponding input terminals (e.g., M0 and M1; /M0 and /M1). A read access is initiated at $t_0$. At $t_1$, the full read signals $V_{LO}$ and $V_{HI}$ are developed on the bitlines. At $t_M$ one or more active test input signals are provided at input terminals of the RST associated with the capacitor set coupled to the bitline having the $V_{LO}$ read signal. The test input signals increases the magnitude of the $V_{LO}$ read signal. For example, an active first input signal increases the $V_{LO}$ signal to $V_{LO1}$, an active second input signal increases $V_{LO}$ to $V_{LO2}$, and active first and second signals increase the $V_{LO}$ signal to $V_{LO3}$. The sense amplifier is activated at $t_2$, amplifying the signals to the full bitline voltage levels. After the signals have been amplified, the sense amplifier is switched off at $t_3$ and the read cycle terminates at $t_4$.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
   a sense amplifier;
   first and second bitlines coupled to the sense amplifier;
   a plurality of memory cells coupled to the sense amplifier, during a memory access, a selected memory cell produces a differential read signal on the bitlines for sensing by the sense amplifier; and
   a test circuit coupled to the bitlines, the test circuit, when activated, varies the magnitude of the differential read signal by varying the capacitance on at least one of the bitlines.

2. The integrated circuit of claim 1 wherein the test circuit comprises:
   a first set of x test capacitors having first terminals coupled to respective first input test signals and second terminals coupled to the first bitline; and
   a second set of y test capacitors having first terminals coupled to respective second input test signals and second terminals coupled to the second bitline.

3. The integrated circuit of claim 2 wherein the first set of test capacitors can vary the first read signal by $2^x-1$ levels and the second set of test capacitors can vary the read signal by $2^y-1$ levels.

4. The integrated circuit of claim 3 wherein the differential read signal includes first and second read signals on first and second bitlines, where one of the first or second read signal is equal to $V_{LO}$ and the other is $V_{HI}$ and the magnitude of the differential read signal is varied by increasing the magnitude of $V_{LO}$ to $V_{LOTest}$, where $V_{LOTest}$ is between $V_{LO}$ and $V_{HI}$.

5. An integrated circuit comprising:
   a sense amplifier;
   first and second bitlines coupled to the sense amplifier;
   a plurality of memory cells coupled to the sense amplifier, wherein the memory cells comprise 2T2C memory cells, during a memory access, a selected memory cell produces a differential read signal on the bitlines for sensing by the sense amplifier; and
   a test circuit coupled to the bitlines, the test circuit, when activated, varies the magnitude of the differential read signal.

6. The integrated circuit of claim 1 wherein a first read signal is provided on the first bitline and a second read signal is provided on the second bitline during a memory access of one memory cell on the bitline pair, the first and second read signal forms the differential read signal, where one of the first or second read signal is equal to $V_{LO}$ and the other is $V_{HI}$.

7. The integrated circuit of claim 6 wherein the test circuit comprises:
   a first set of x test capacitors having first terminals coupled to respective first input test signals and second terminals coupled to the first bitline; and
   a second set of y test capacitors having first terminals coupled to respective second input test signals and second terminals coupled to the second bitline.

8. The integrated circuit of claim 7 wherein the capacitors within the first set have different values and the capacitors within the second set have different values.

9. The integrated circuit of claim 8 wherein the first set of test capacitors can vary the first read signal by $2^x-1$ levels and the second set of test capacitors can vary the second read signal by $2^y-1$ levels.

10. The integrated circuit 9 of claim wherein x=y.

11. The integrated circuit of claim 6 wherein the test circuit comprises:
    a first test capacitor having first and second terminals, the first terminal coupled to a first test input terminal and the second terminal coupled to the first bitline; and
    a second test capacitor having first and second terminals, the first terminal coupled to a second test input terminal and the second terminal coupled to the second bitline.

12. The integrated circuit of claim 11 wherein a first active test signal at the first test input terminal increases the magnitude of the first read signal.

13. The integrated circuit of claim 11 wherein a second active test signal at the second test input terminal increases the magnitude of the second read signal.

14. The integrated circuit of claim 11 wherein an active test signal is provided at either the first or second test input terminal to increase the magnitude of the first or second read signal.

15. The integrated circuit of claim 14 wherein the magnitude of the read signal equal to $V_{LO}$ is increased to reduce the differential read signal.

16. The integrated circuit of claim 15 wherein the magnitude of $V_{LO}$ is increased to $V_{LOTest}$, where $V_{LOTest}$ is between $V_{LO}$ and $V_{HI}$.

17. The integrated circuit of claim 15 wherein the magnitude of $V_{LO}$ is increased to $V_{LOTest}$, where $V_{LOTest}$ is equal to about half way between $V_{LO}$ and $V_{HI}$.

18. The integrated circuit of claim 15 wherein the magnitude of $V_{LO}$ is increased to $V_{LOTest}$, where $V_{LOTest}$ is equal to about one third between $V_{LO}$ and $V_{HI}$.

19. The integrated circuit of claim 15 wherein the increase in magnitude of the read signal depends on the capacitance of the test capacitor and magnitude of the active test signal.

20. The integrated circuit of claim 19 wherein the magnitude of $V_{LO}$ is increased to $V_{LOTest}$, where $V_{LOTest}$ is between $V_{LO}$ and $V_{HI}$.

21. The integrated circuit of claim 19 wherein the magnitude of $V_{LO}$ is increased to $V_{LOTest}$, where $V_{LOTest}$ is equal to about half way between $V_{LO}$ and $V_{HI}$.

22. The integrated circuit of claim 19 wherein the magnitude of $V_{LO}$ is increased to $V_{LOTest}$, where $V_{LOTest}$ is equal to about one third between $V_{LO}$ and $V_{HI}$.

23. An integrated circuit comprising:
    a sense amplifier;
    first and second bitlines coupled to the sense amplifier;
    a plurality of memory cells coupled to the sense amplifier, wherein the memory cells comprises 2T2C ferroelectric memory cells, during a memory access, a selected memory cell produces a differential read signal on the bitlines for sensing by the sense amplifier; and
    a test circuit coupled to the bitlines, the test circuit, when activated, varies the magnitude of the differential read signal.

24. An integrated circuit comprising:
    a sense amplifier;
    first and second bitlines coupled to the sense amplifier;
    a plurality of memory cells coupled to the sense amplifier, during a memory access, a selected memory cell produces a differential read signal on the bitlines for sensing by the sense amplifier, the differential read signal includes first and second read signals on first and second bitlines, where one of the first or second read signal is equal to $V_{LO}$ and the other is $V_{HI}$; and a test circuit coupled to the bitlines, the test circuit, when activated, varies the magnitude of the differential read signal.

25. A method of operating an integrated circuit (IC) comprising:

providing the IC with a sense amplifier coupled to first and second bitlines having a plurality of memory cells coupled thereto, wherein when one memory cell is selected for a read access, the selected memory cell produces a differential read signal on the bitlines for sensing by the sense amplifier, the differential read signal indicating a first or a second state being stored in the selected memory cell, the differential read signal includes a first read signal provided on the first bitline and a second read signal provided on the second bitline of the bitline pair, where one of the first or second read signal is equal to $V_{LO}$ and the other is $V_{HI}$; and activating a test circuit coupled to the bitlines during test mode to vary the magnitude of the differential read signal by varying the capacitance on at least one of the bitlines.

26. The method of claim 25 wherein varying the capacitance on at least one of the bitlines comprises coupling a first test capacitor to a first bitline.

27. The method of claim 26 wherein varying the capacitance on at least one of the bitlines further comprises coupling a second test capacitor to a second bitline.

28. The method of claim 25 wherein the test circuit comprises:

a first test capacitor having first and second terminals, the first terminal coupled to a first test input terminal and the second terminal coupled to the first bitline; and a second test capacitor having first and second terminals, the first terminal coupled to a second test input terminal and the second terminal coupled to the second bitline.

29. The method of claim 28 wherein applying a first active test signal at the first test input terminal increases the magnitude of the first read signal and applying a second test signal at the second test input terminal increases the magnitude of the second read signal.

30. The method of claim 28 wherein applying an active test signal at either the first or second test input terminal increases the magnitude of the first or second read signal.

31. The method of claim 30 wherein increasing the magnitude of the read signal equal to $V_{LO}$ reduces the differential read signal.

32. The method of claim 31 wherein increasing the magnitude of the read signal equal to $V_{LO}$ comprises increasing the magnitude of $V_{LO}$ to $V_{LOTest}$, where $V_{LOTest}$ is between $V_{LO}$ and $V_{HI}$.

33. The method of claim 31 wherein increasing the magnitude of the read signal equal to $V_{LO}$ comprises increasing the magnitude of $V_{LO}$ to $V_{LOTest}$, where $V_{LOTest}$ is equal to about half way between $V_{LO}$ and $V_{HI}$.

34. The method of claim 31 wherein increasing the magnitude of the read signal equal to $V_{LO}$ comprises increasing the magnitude of $V_{LO}$ to $V_{LOTest}$, is equal to about one third between $V_{LO}$ and $V_{HI}$.

35. The method of claim 31 wherein the increase in magnitude of the read signal depends on the capacitance of the test capacitor and magnitude of the active test signal.

36. The method of claim 25 wherein the test circuit comprises:

a first set of x test capacitors having first terminals coupled to respective first input test signals and second terminals coupled to the first bitline; and a second set of y test capacitors having first terminals coupled to respective second input test signals and second terminals coupled to the second bitline.

37. The method of claim 36 wherein the capacitors within the first set have different values and the capacitors within the second set have different values.

38. The method of claim 37 comprises varying the first read signal by $2^x-1$ levels using the first set of test capacitors and varying the second read signal by $2^y-1$ using the second set of test capacitors.

39. The method of claim 38 wherein $x=y$.

* * * * *